United States Patent
Lim et al.

(10) Patent No.: US 10,698,146 B2
(45) Date of Patent: Jun. 30, 2020

(54) POLARIZED FILM AND DISPLAY DEVICE HAVING THE SAME

(71) Applicant: LG DISPLAY CO., LTD., Seoul (KR)

(72) Inventors: Heechul Lim, Paju-si (KR); GyuHyeong Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 56 days.

(21) Appl. No.: 15/245,390

(22) Filed: Aug. 24, 2016

(65) Prior Publication Data

US 2017/0153371 A1 Jun. 1, 2017

(30) Foreign Application Priority Data

Nov. 30, 2015 (KR) .................. 10-2015-0169544

(51) Int. Cl.
*G02B 5/30* (2006.01)
*H01L 51/52* (2006.01)
*G02B 1/14* (2015.01)

(52) U.S. Cl.
CPC ............ *G02B 5/3041* (2013.01); *G02B 1/14* (2015.01); *G02B 5/3083* (2013.01); *H01L 51/5237* (2013.01); *H01L 51/5281* (2013.01); *H01L 51/5253* (2013.01); *H01L 2251/5338* (2013.01)

(58) Field of Classification Search
CPC .... G02B 5/3041; G02B 5/305; G02B 5/3083; G02B 1/11; G02B 1/111; G02B 1/14; G02B 1/16; G02B 27/281; G02B 27/286; H01L 51/5237; H01L 51/5281; H01L 51/5253; H01L 51/5256; H01L 2251/5338

USPC ....................... 428/1.31; 359/488.01
See application file for complete search history.

(56) References Cited

U.S. PATENT DOCUMENTS

| | | | |
|---|---|---|---|
| 2003/0155861 A1 | 8/2003 | Nishizawa et al. | |
| 2008/0129189 A1* | 6/2008 | Cok | B82Y 20/00 313/503 |
| 2013/0032830 A1* | 2/2013 | Lee | G02B 5/3041 257/88 |
| 2014/0226206 A1 | 8/2014 | Park | |

FOREIGN PATENT DOCUMENTS

| | | |
|---|---|---|
| CN | 102626833 A | 8/2012 |
| CN | 102916034 A | 2/2013 |
| CN | 104700771 A | 6/2015 |
| KR | 10-2011-0093536 A | 8/2011 |

* cited by examiner

*Primary Examiner* — Marin Pichler
(74) *Attorney, Agent, or Firm* — Dentons US LLP

(57) ABSTRACT

Disclosed herein are an anti-reflection polarizing film and a display device having the same. The anti-reflection polarizing film includes: a polarization layer configured to linearly polarize external light; a phase-difference layer configured to circularly polarize the light transmitted through the polarization layer; a first support layer between the polarization layer and the phase-difference layer, configured to protect the polarization layer; and a second support layer facing the first support layer with the polarization layer therebetween, configured to protect the polarization layer, wherein a part of a particular layer among the layers facing the second support layer is extended towards an edge.

3 Claims, 4 Drawing Sheets

POLARIZED FILM AND DISPLAY DEVICE HAVING THE SAME

CROSS-REFERENCE TO RELATED APPLICATIONS

This application claims priority from Korean Patent Application No. 10-2015-0169544 filed on Nov. 30, 2015, in the Korean Intellectual Property Office, the disclosure of which is incorporated herein by reference.

BACKGROUND

Technical Field

The present disclosure relates to an anti-reflection polarizing film and a display device having the same.

Description of the Related Art

As information technology has developed display devices that represent information in the form of visual images are in widespread use. In accordance with such development, various display panels that can be implemented in devices which are thinner, lighter and consume less power have been developed to rapidly replace existing CRTs (Cathode Ray Tubes).

Exemplary display devices include LCD (Liquid Crystal Display), OLED (Organic Light Emitting Display), EPD (Electrophoretic Display, Electronic Paper Display), PDP (Plasma Display Panel), FED (Field Emission Display), an ELD (Electro Luminescence Display), EWD (Electro-Wetting Display), etc. Display devices have a display panel to produce images. Such a display panel includes a pair of substrates attached together, with a luminescent material and/or a polarizing material between the substrates.

An organic light-emitting display (OLED) is a self-luminance display device and thus does not require an additional light source such as those used in a liquid-crystal display (LCD). Accordingly, the OLED can be lighter and thinner. In addition, an OLED is advantageous over an LCD in terms of viewing angle, contrast and power consumption. In addition, an OLED is driven with low DC voltage, has a fast response speed, is robust to external impact due to its solid-phase internal components, and is workable in a wide range of temperatures.

An OLED may include a window substrate covering a display panel. In addition, an OLED may include a touch screen panel that detects a position touched by a user to convert such touch inputs into electric signals. When a window substrate and/or a touch screen panel is disposed on the display panel, external light is reflected off the window substrate and/or the touch screen panel. Accordingly, a viewer or user perceives the reflected light containing no image information, and thus the image quality of the OLED may be degraded.

SUMMARY

In view of the above, an object of the present disclosure is to provide an anti-reflection polarizing film in which a part of a particular layer is extended towards an edge to avoid an adhesive material applied on the part from being damaged when the polarizing film is bent, and a display device including the same.

It should be noted that objects of the present disclosure are not limited to the above-described objects, and other objects of the present disclosure will be apparent to those skilled in the art from the following descriptions.

According to an aspect of the present disclosure, there is provided an anti-reflection polarizing film including: a polarization layer configured to linearly polarize light; a phase-difference layer configured to circularly polarize light passing through the polarization layer; a first support layer between the polarization layer and the phase-difference layer, configured to protect the polarization layer; and a second support layer facing the first support layer with the polarization layer therebetween, configured to protect the polarization layer, wherein a part of a particular layer among the layers facing the second support layer extends further than an edge of at least one other layer.

According to another aspect of the present disclosure, there is provided a display device including: a flexible display panel having a display area and a bezel area surrounding the display area; a circularly-polarizing film on the flexible display panel, comprising a plurality of layers and configured to absorb some of light reflected from a surface of the flexible display panel; a circuit unit connected to the flexible display panel and configured to supply electric signals to the flexible display panel; and an adhesive member configured to attach a part of a particular layer among the plurality of layers of the circularly-polarizing film to the circuit unit, wherein the part of the particular layer extends towards an edge of the bezel area.

According to yet another aspect of the present disclosure, there is provided a structure including: an upper film stack in which a hard coating film, an upper tri-acetate cellulose film, and a polarizing film are stacked in order; and a lower film stack in which a lower tri-acetate cellulose film and a phase-difference film are stacked in order, the lower film stack located under and in contact with the upper film stack, wherein the lower tri-acetate cellulose film comprises an area where an adhesive material is to be applied, which is not covered by the upper film stack.

According to exemplary embodiments of the present disclosure, it is possible to avoid an adhesive material applied on a part of a particular layer from being damaged when a display panel and an anti-reflection polarizing film are bent.

According to exemplary embodiments of the present disclosure, it is possible to minimize influence of an adhesive material on polarization of external light in an anti-reflection polarizing film.

In addition, according to exemplary embodiments of the present disclosure, a barrier film for protecting a display panel between the display panel and an anti-reflection polarizing film is not required, and thus it is possible to minimize decreasing a transmittance ratio of images in a display device having the display panel.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
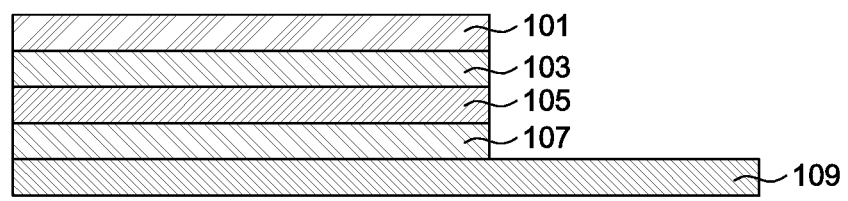
FIG. 1 is a cross-sectional view of an anti-reflection polarizing film according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the present disclosure thorough and for fully conveying the scope of the present disclosure to those skilled in the art. It is to be noted that the scope of the present disclosure is defined only by the claims.

The figures, dimensions, ratios, angles, and the numbers of elements given in the drawings are merely illustrative and are not limiting. Like reference numerals denote like elements throughout the descriptions. Further, descriptions of well-known technologies may be omitted in order not to unnecessarily obscure the gist of the present disclosure.

It is to be noted that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

As used herein, the terms "x-direction," "y-direction" and "z-direction" are not limited to three orthogonal directions used in the Cartesian coordinate system but have broader directivity to indicate the directions in which the elements of exemplary embodiments of the present disclosure function.

The term "at least one" is to be interpreted as comprising all possible combinations of the elements listed thereafter. For example, the phrase "at least one of a first element, a second element and a third element" may refer to the first element, the second element or the third element, as well as all possible combinations of two or more of them.

The image quality of an OLED device may be degraded by the reflection of external light. To avoid this, a polarizing film may be disposed on a display panel of an OLED device. The display panel of the OLED device may be used in a flexible display device. A protection film or a barrier film is used between the display panel and the polarizing film for protecting the display panel. The display panel is connected to a circuit unit.

An adhesive is used to attach a part of the protection film disposed under the polarizing film that is extended towards an edge, to the circuit unit disposed to the display panel. The adhesive can securely maintain the connection between the circuit unit and the display panel when the display panel and the polarizing film are bent. The protection film is an essential element because the adhesive, which protects the display panel and securely maintains the connection between the circuit unit and the display panel, is attached to the protection film and not to the polarizing film. The protection film may result in decreasing the transmittance ratio of images in the display device.

To avoid image quality degradation by the reflected light and improve transmittance ratio of the display device, the inventors of the application have attempted to remove the protection film. If the protection film is removed, however, the adhesive may be attached to a side surface of the polarizing film. If the adhesive is attached to a side surface of the polarizing film, the adhesive may be damaged at the side surface when the display panel and the polarizing film are bent, and thus the connection between the display panel and the circuit unit cannot be secured. In addition, the adhesive may be applied on the display area of the polarizing film during the process of applying the adhesive, such that it may affect images displayed by the display panel.

To overcome such problems, the present inventors have studied a way of using a polarizing film without a protection film, and have solved the problems of damage to the adhesive, the adhesive being applied on the display area or polarizing film. Accordingly, the inventors of the application have devised a polarizing film having a novel structure that suppresses the degradation of the image quality by the reflected light and decrease in transmittance ratio while solving the problems, and a display panel employing it.

Features of various exemplary embodiments of the present disclosure may be combined partially or totally. As will be clearly appreciated by those skilled in the art, technically various interactions and operations are possible. Various exemplary embodiments can be practiced individually or in combination.

Figure 2:
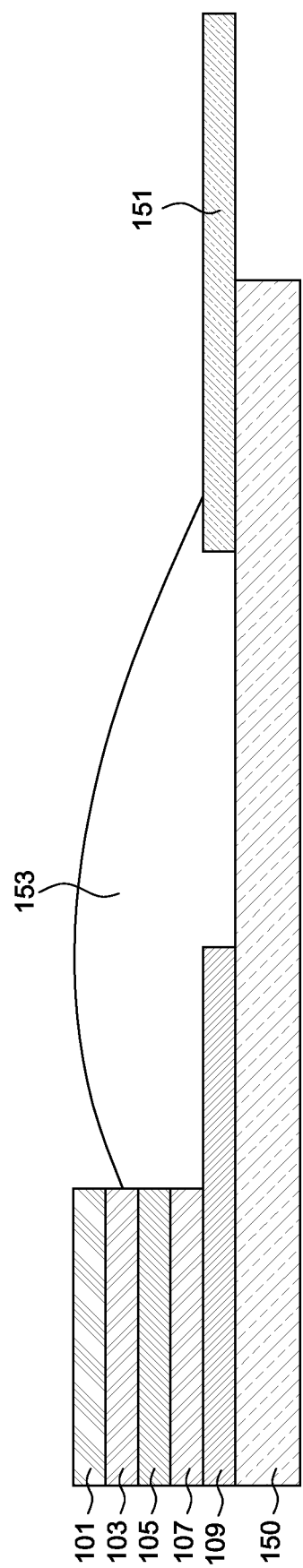
FIG. 2 is a cross-sectional view of a display panel employing the anti-reflection polarizing film shown in FIG. 1.

FIG. 1 is a cross-sectional view of an anti-reflection polarizing film according to an exemplary embodiment of the present disclosure. FIG. 2 is a cross-sectional view of a display panel employing the anti-reflection polarizing film shown in FIG. 1.

The structure of the anti-reflection polarizing film 100 and the display panel 150 employing it will be described together with reference to FIGS. 1 and 2.

As shown in FIG. 1, the anti-reflection polarizing film 100 (or a circularly-polarizing film) may include a phase-difference layer 109, a first support layer 107, a second support layer 103, a polarization layer 105, and a hard coating layer 101.

The hard coating layer (or a hard coating film) 101 may be disposed on the top of the anti-reflection polarizing film 100. The hard coating layer 101 may be disposed above the first support layer 107. The hard coating layer 101 disposed on the top may be exposed to the outside. The hard coating layer 101 may avoid the surface of the anti-reflection polarizing film 100 from being contaminated by particles from the outside or the like. That is, the hard coating layer 101 may protect other layers thereunder. The hard coating layer 101 may include a transparent resin and thus may have non-optical properties.

The polarization layer (or the polarizing film) 105 may be disposed below the hard coating layer 101. The polarization layer 105 may be disposed between the first support layer 107 and the second support layer 103.

For example, the polarization layer 105 may include polyvinyl alcohol (PVA) and have a transmission axis in a direction. Accordingly, the polarization layer 105 only transmits light parallel with the transmission axis. Accordingly, the transmitted light is linearly polarized.

The phase-difference layer (or a phase-difference film or retardation layer or retardation film) 109 may be disposed below the polarization layer 105. The polarization layer 105 and the phase-difference layer 109 may be disposed in order. The phase-difference layer 109 may be disposed under the first support layer 107.

The phase-difference layer 109 may be a λ/4 phase-difference layer (quarter-wave plate, QWP). The phase-difference layer 109 may have a polarization axis (or a slow axis) and may retard the phase of the light transmitting along the polarization axis. Accordingly, the phase-difference layer 109 may convert linearly-polarized light into circularly-polarized light and vice versa.

External light may pass through the polarization layer 105, which may linearly polarize the external light. Specifically, if the polarization layer 105 has the transmission axis in parallel with the x-axis direction (or the y-axis direction), the light may be converted into a linearly polarized light transmitting in the x-axis direction through the polarization layer 105.

The light linearly-polarized by the polarization layer 105 may transmit the phase-difference layer 109. The phase-difference layer 109 may be, but is not limited to, a λ/4 phase-difference layer (quarter-wave plate, QWP). If the polarization axis (or the slow axis) of the phase-difference layer 109 makes an angle between +40 degrees and +50 degrees (or −40 degrees and −50 degrees) with the transmission axis of the polarization layer 105, for example, the light linearly polarized by the polarization layer 105 may transmit the phase-difference layer 109 to be right-circularly-polarized (or left-circularly-polarized).

The light that has been right-circularly-polarized by the phase-difference layer 109 may be reflected off the display panel 150. That is, some of the external light may be absorbed through the polarization layer 105 and the phase-difference layer 109, and the rest of the external light may be reflected off the display panel 150 to become reflected light. The reflected light may be right-circularly-polarized (or left-circularly-polarized) once again through the phase-difference layer 109.

The reflected light transmitted from the phase-difference layer 109 may transmit to the polarization layer 109 once again. Since the phase of the reflected light has been shifted once again in the phase-difference layer 109, only a little of the reflected light may transmit to the polarization layer 105. That is, some of the reflected light may be absorbed through the polarization layer 105 and the phase-difference layer 109, and the rest of the reflected light may exit.

In other words, as the external light repeatedly transmits to the phase-difference layer 109 and the polarization layer 105, most of the external light can be absorbed. Accordingly, the anti-reflection polarizing film 100 having the polarization layer 105 and the phase-difference layer 109 may minimize the degradation of the image quality by the reflected light from the external light.

The first support layer 107 may be disposed between the polarization layer 105 and the phase-difference layer 109. The first support layer 107 may protect the polarization layer 105.

The second support layer (or a second auxiliary support layer) 103 may be disposed on the polarization layer 105. The second support layer 103 faces the first support layer 107 with the polarization layer 105 therebetween. Accordingly, the second support layer 103 may protect the polarization layer 105.

The first support layer 107 and the second support layer 103 may be made of tri-acetate cellulose (TAC), for example, and thus may have better durability than the phase-difference layer 109, and have non-optical properties. Accordingly, the second support layer 103 may protect the phase-difference layer 109. The first support layer 107 and the second support layer 103 may also be referred to as TAC films. A part of a particular layer of the anti-reflection polarizing film 100 that faces the second support layer 103 may extends further than an edge of at least one other layer.

The hard coating layer 101, the second support 103 and the polarization layer 105 may be stacked on one another in order. The layers may be referred to as an upper film stack of the anti-reflection polarizing film 100.

The first support layer 107 and the phase-difference layer 109 may be stacked on each other in order. The layers may be referred to as a lower film stack of the anti-reflection polarizing film 100. The lower film stack may be located under and be in contact with the upper film stack. In addition, the first support layer 107 of the lower film stack may be included in the upper film stack.

As shown in FIG. 2, the anti-reflection polarizing film 100 may be disposed on the display panel 150. The display panel 150 may be a flexible display panel having a display area and a bezel area surrounding the display area.

The flexible display panel (or the plastic substrate) 150 includes circuit unit 151. The circuit unit 151 may be connected to the flexible display panel 150 to supply electric signals.

A part of a particular layer of the anti-reflection polarizing film 100 may be extended towards an edge. In addition, the particular layer may face the second supply layer 103. The particular layer may include at least the phase-difference layer 109. That is, the particular layer may be the phase-difference layer 109. Accordingly, a part of the phase-difference layer 109 of the anti-reflection polarizing film 100 may be extended towards an edge.

An adhesive material (or an adhesive member) 153 may be attached on the part of the phase-difference layer 109 extended towards the edge. In addition, the adhesive material 153 may be attached to the circuit unit 151 of the flexible display panel 150. That is, the adhesive material 153 may be used to attach the circuit unit 151 connected to the flexible display panel 150 to the part of the phase-difference layer 109. The adhesive material 153 may securely maintain the connection between the circuit unit 151 and the flexible display panel 150 when the flexible display panel 150 and the anti-reflection polarizing film 100 are bent.

The adhesive material 153 may be applied on the upper surface and on the side surface of the part of the phase-difference layer 109. Accordingly, the adhesive material 153 may be securely attached on the phase-difference layer 109.

Accordingly, it is possible to minimize the adhesive material 153 from being damaged when the display panel 150 and the anti-reflection polarizing film 100 are bent.

In addition, the part of the phase-difference layer 109 may be disposed in an area corresponding to the bezel area of the flexible display panel 150. In this case, the adhesive material 153 may be attached to an area of the phase-difference layer 109 that corresponds to the bezel area, not the area corresponding to the display area of the display panel 150. Accordingly, it is possible to minimize the influence of the adhesive material 153 on the polarization of the external light in the anti-reflection polarizing film 100.

In addition, since the part of the phase-difference layer 109 is extended towards the edge, the anti-reflection polarizing film 100 may not require the barrier film for protecting the flexible display panel 150 between the flexible display panel 150 and the anti-reflection polarizing film 100. As a result, it is possible to minimize any decrease in transmittance ratio of images in the OLED device including the flexible display panel 150.

Figure 3:
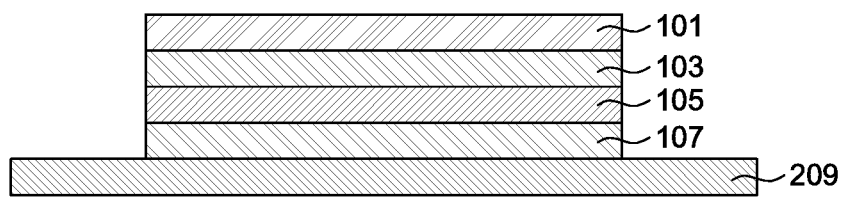
FIG. 3 is a cross-sectional view of an anti-reflection polarizing film according to another exemplary embodiment of the present disclosure.

FIG. 3 is a cross-sectional view of an anti-reflection polarizing film according to another exemplary embodiment of the present disclosure.

An anti-reflection polarizing film 200 shown in FIG. 3 is substantially identical to the anti-reflection polarizing film 100 shown in FIG. 1 except for the structure of the particular layer; and, therefore, the redundant description will be omitted.

In the anti-reflection polarizing film 200 shown in FIG. 3 a part of a particular layer may be extended towards another edge opposed to an edge. In addition, the particular layer may face the second supply layer 103. The particular layer may be the phase-difference layer 209. That is, apart of the phase-difference layer 209 is extended towards an edge and the other part of the phase-difference layer 209 is extended towards another edge opposed to the edge. The anti-reflection polarizing film 200 with the parts extended from the respective edges may be applied when two or more opposing circuit units are connected to the flexible display panel.

An adhesive material (or an adhesive member) may be attached on the parts of the phase-difference layer 209. In addition, the adhesive material may be attached to the circuit units of the flexible display panel. That is, the adhesive material may be used to attach the circuit units connected to the flexible display panel to the respective parts of the phase-difference layer 209. The adhesive material can securely maintain the connection between the circuit units and the flexible display panel when the flexible display panel and the polarizing film 200 are bent.

The adhesive material may be applied on the upper surface and on the side surface of the parts of the phase-difference layer 209. Accordingly, the adhesive material may be securely attached on the phase-difference layer 209. Accordingly, it is possible to minimize damage to the adhesive material 153 applied on the parts of the phase-difference layer 209 when the display panel and the anti-reflection polarizing film 200 are bent.

Figure 4:
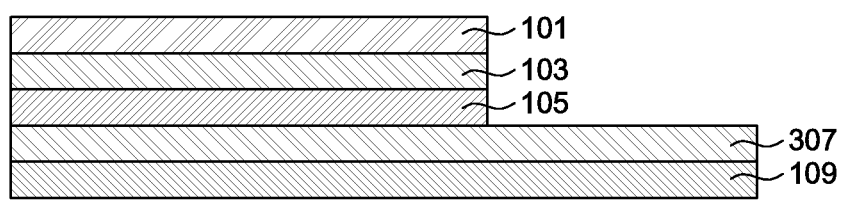
FIG. 4 is a cross-sectional view of an anti-reflection polarizing film according to another exemplary embodiment of the present disclosure.

FIG. 4 is a cross-sectional view of an anti-reflection polarizing film according to another exemplary embodiment of the present disclosure.

An anti-reflection polarizing film 300 shown in FIG. 4 is substantially identical to the anti-reflection polarizing film 300 shown in FIG. 1 except for the structure of the particular layer; and, therefore, the redundant description will be omitted.

A particular layer of the anti-reflection polarizing film 300 shown in FIG. 4 may include a plurality of layers disposed below the second support layer 103. The particular layer may include at least the first support layer 307 and the phase-difference layer 109. That is, the particular layer may be the first support layer 307 and the phase-difference layer 109.

The first support layer 307 may be disposed between the polarization layer 105 and the phase-difference layer 109. The first support layer 307 may be disposed under the polarization layer 105 and may protect the polarization layer 105. In addition, the first support layer 307 may be disposed on the phase-difference layer 109 and may protect the phase-difference layer 109.

In addition, a part of each of the first support layer 307 and the phase-difference layer 109 of the anti-reflection polarizing film 300 may be extended towards an edge. Also, the end portions of the first support layer 307 and the phase-difference layer 109 can be aligned together.

An adhesive material (or an adhesive member) may be attached on the upper surface and side surface of the extended part of the first support layer 307 and on the side surface of the extended part of the phase-difference layer 109. In addition, the adhesive material may be attached to circuit unit of the flexible display panel. That is, the adhesive material may be used to attach the circuit unit connected to the flexible display panel to the parts of the first support layer 307 and the phase-difference layer 109. The adhesive material can securely maintain the connection between the circuit unit and the flexible display panel when the flexible display panel and the polarizing film 300 are bent.

In other words, on the upper surface of the part of the first support layer 307 of the lower film stack, which is not covered by the upper film stack, the adhesive material is applied. Accordingly, the adhesive material is applied on the part of the lower film stack. The adhesive material may cover the entire end portion of the lower film stack and a part of the circuit unit located on the end of the flexible display panel.

The size of the area in which the adhesive material is disposed may be dependent on a size of a flexible display panel or bending degrees of the end portion. For example, the area formed in the lower film stack may correspond to the bezel area of the flexible display panel. Accordingly, as the area of the bezel area increases, the applied area of the adhesive material can be increased. The adhesive material may be applied on an area that can be increased. By doing so, the adhesive material can be attached to the anti-reflection polarizing film 300 more securely. Further, as the bend of the flexible display panel increases, the bend of the adhesive material can be increased. In case the area in which the adhesive material is applied increases, the force exerted in the adhesive material is dispersed. As the force exerted on the adhesive material is dispersed, it is possible to minimize damage to the adhesive material.

Accordingly, the adhesive material is disposed in the area, and thus the rear surface of the display device along with the end portion of the flexible display panel may be bent.

The adhesive material may be applied on the upper surface and on the side surface of the part of the first support layer 307 and on the side surface of the part of the phase-difference layer 109. Accordingly, the adhesive material can be securely attached on the first support layer 307. Accordingly, it is possible to minimize the adhesive material applied on the part of the first support layer 307 from being damaged when the display panel and the anti-reflection polarizing film 300 are bent.

In addition, the part of the first support layer 307 and the part of the phase-difference layer 109 may be disposed in an area corresponding to the bezel area of the flexible display panel. In this case, the adhesive material may be attached to the area corresponding to the bezel area, not the area of the first support layer 307 that corresponds to the display area of the display panel. Accordingly, it is possible to minimize the influence of the external light on the anti-reflection polarizing film 300 by the adhesive material 150.

In addition, since the part of the first support layer 307 and the part of the phase-difference layer 109 is extended towards an edge, the anti-reflection polarizing film 300 may not require the barrier film for protecting the flexible display panel 150 between the flexible display panel and the anti-reflection polarizing film 300. That is, there may be no protection film in contact with the lower film stack. As a result, it is possible to minimize a decrease in transmittance ratio of images in the OLED device including the flexible display panel 150.

Figure 5:
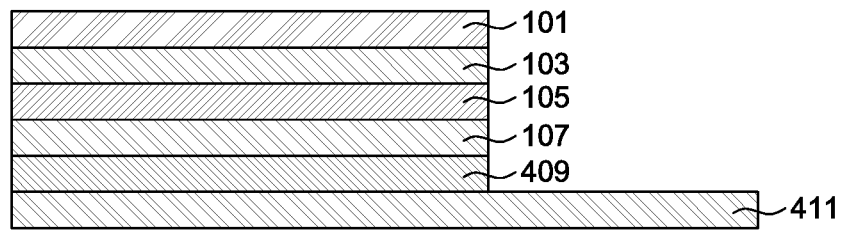
FIG. 5 is a cross-sectional view of an anti-reflection polarizing film according to another exemplary embodiment of the present disclosure.

FIG. 5 is a cross-sectional view of an anti-reflection polarizing film according to another exemplary embodiment of the present disclosure.

An anti-reflection polarizing film 400 shown in FIG. 5 is substantially identical to the anti-reflection polarizing film 100 shown in FIG. 1 except for the structure of the anti-reflection polarizing film and the structure of the particular layer; and, therefore, the redundant description will be omitted.

The anti-reflection polarizing film 400 shown in FIG. 5 may include a third support layer 411.

The third support layer (or a third auxiliary support layer) 411 may be disposed under a phase-difference layer 409. The third support layer 411 faces the first support layer 107 with the phase-difference layer 409 therebetween. Accordingly, the third support layer 411 may protect the phase-difference layer 409.

The third support layer 411 may be made of tri-acetate cellulose (TAC), for example, and thus may have better durability than the phase-difference layer 409, and non-optical properties. Accordingly, the third support layer 411 may also be referred to as a TAC film.

A particular layer of the anti-reflection polarizing film 400 shown in FIG. 5 may be the third support layer 411. A part of the third support layer 411 of the anti-reflection polarizing film 400 may be extended towards an edge.

An adhesive material (or an adhesive member) may be attached on the extended part of the third support layer 411. In addition, the adhesive material may be attached to circuit unit of the flexible display panel. That is, the adhesive material may be used to attach the circuit unit connected to the flexible display panel to the part of the third support layer 411. The adhesive material can securely maintain the connection between the circuit unit and the flexible display panel when the flexible display panel and the polarizing film 400 are bent.

The adhesive material may be applied on the upper surface and on the side surface of the part of the third support layer. Accordingly, the adhesive material can be securely attached on the third support layer 411. Accordingly, it is possible to minimize the adhesive material applied on the part of the third support layer 411 from being damaged when the display panel and the anti-reflection polarizing film 400 are bent.

In addition, the part of the third support layer 411 may be disposed in an area corresponding to the bezel area of the flexible display panel. In this case, the adhesive material may be attached to the area corresponding to the bezel area, not the area of the phase-difference layer 409 that corresponds to the display area of the display panel. Accordingly, it is possible to minimize the influence of the external light on the anti-reflection polarizing film 400 by the adhesive material 150.

In addition, since the part of the third support layer 411 is extended towards an edge, the anti-reflection polarizing film 400 may not require the barrier film for protecting the flexible display panel between the flexible display panel and the anti-reflection polarizing film 400. As a result, it is possible to minimize a decrease in transmittance ratio of images in the OLED device including the flexible display panel.

Figure 6:
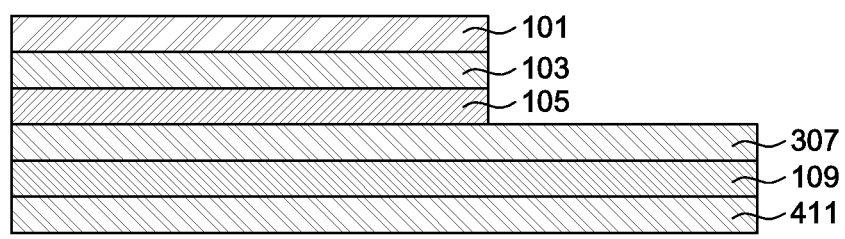
FIG. 6 is a cross-sectional view of an anti-reflection polarizing film according to another exemplary embodiment of the present disclosure.

FIG. 6 is a cross-sectional view of an anti-reflection polarizing film according to another exemplary embodiment of the present disclosure.

An anti-reflection polarizing film 500 shown in FIG. 6 is substantially identical to the anti-reflection polarizing film 400 shown in FIG. 5 except for the structure of the particular layer; and, therefore, the redundant description will be omitted.

A particular layer of the anti-reflection polarizing film 500 shown in FIG. 6 may include a plurality of layers disposed below the second support layer 103. The particular layer may include at least a first support layer 307, a phase-difference layer 109 and a third support layer 411.

In addition, a part of each of the first support layer 307, the phase-difference layer 109 and the third support layer 411 of the anti-reflection polarizing film 500 may be extended towards an edge. Also, the end portions of the first support layer 307, the phase-difference layer 109 and the third support layer 411 can be aligned together.

An adhesive material (or an adhesive member) may be attached on the upper surface and side surface of the extended part of the first support layer 307, on the side surface of the extended part of the phase-difference layer 109, and on the side surface of the extended part of the third support layer 411. In addition, the adhesive material may be attached to circuit unit of the flexible display panel. That is, the adhesive material may be used to attach the circuit unit connected to the flexible display panel to the parts of the first support layer 307, the phase-difference layer 109 and the third support layer 411. The adhesive material can securely maintain the connection between the circuit unit and the flexible display panel when the flexible display panel and the polarizing film 500 are bent.

The adhesive material may be applied on the upper surface and the side surface of the part of the first support layer 307, on the side surface of the part of the phase-difference layer 109, and on the side surface of the third support layer 411. Accordingly, the adhesive material can be securely attached on the first support layer 307. Accordingly, it is possible to minimize damage to the adhesive material applied on the part of the first support layer 307 when the display panel and the anti-reflection polarizing film 500 are bent.

In addition, the part of the first support layer 307, the part of the phase-difference layer 109 and the part of the third support layer 411 may be disposed in an area corresponding to the bezel area of the flexible display panel. In this case, the adhesive material may be attached to the area corresponding to the bezel area, and not the area of the first support layer 307 that corresponds to the display area of the display panel. Accordingly, it is possible to minimize the influence of the external light on the anti-reflection polarizing film 500 by the adhesive material 150.

In addition, since the part of the first support layer 307, the part of the phase-difference layer 109 and the part of the third support layer 411 are extended towards an edge, the anti-reflection polarizing film 500 may not require the barrier film for protecting the flexible display panel between the flexible display panel and the anti-reflection polarizing film 500. As a result, it is possible to minimize a decrease in transmittance ratio of images in the OLED device including the flexible display panel.

The exemplary embodiments of the present disclosure can also be described as follows:

According to an aspect of the present disclosure, an anti-reflection polarizing film includes: a polarization layer configured to linearly polarize light; a phase-difference layer configured to circularly polarize light passed through the polarization layer; a first support layer disposed between the polarization layer and the phase-difference layer, configured to protect the polarization layer; and a second support layer facing the first support layer with the polarization layer therebetween, configured to protect the polarization layer, wherein a part of a particular layer among the layers facing the second support layer extends further than an edge of at least one other layer.

The part of the particular layer may minimize damage to an adhesive material applied on the part when the anti-reflection polarizing film is bent, and minimize influence of the adhesive material on polarization of the external light.

The particular layer may be the phase-difference layer.

The particular layer may include the first support layer.

The anti-reflection polarizing film may further include: a third support layer facing the first support layer with the phase-difference layer therebetween to protect the phase-difference layer, and the particular layer may be the third support layer.

The particular layer may include the phase-difference layer and the first support layer.

The part of the particular layer may be extended towards another edge that is opposed to the edge.

According to another aspect of the present disclosure, there is provided a display device including: a flexible display panel having a display area and a bezel area surrounding the display area; a circularly-polarizing film on the flexible display panel comprising a plurality of layers and configured to absorb some light reflected from a surface of the flexible display panel; circuit unit connected to the flexible display panel and configured to supply electric signals to the flexible display panel; and an adhesive member configured to attach a part of a particular layer among the plurality of layers of the circularly-polarizing film to the circuit unit, wherein the part of the particular layer extends towards an edge of the bezel area.

The part of the particular layer may minimize damage to the adhesive member when the flexible display panel is bent, and attach the adhesive member to an area of the circularly-polarizing film that corresponds to the bezel area to minimize influence on polarization of the external light in the display area.

The plurality of layers may include at least a polarization layer, a phase-difference layer and a support layer disposed between the polarization layer and the phase-difference layer, and the particular layer may include at least the phase-difference layer.

The particular layer may include at least the support layer.

The plurality of layers may include a first auxiliary support layer facing the support layer with the polarization layer therebetween to protect the polarization layer, and the particular layer may include a plurality of layers disposed below the first auxiliary support layer.

The plurality of layers may include a second auxiliary support layer facing the support layer with the phase-difference layer therebetween to protect the phase-difference layer, and the particular layer may include at least the second auxiliary support layer.

The circularly-polarizing film may have a structure that does not include the need for a barrier film for protecting the flexible display panel between the flexible display panel and the anti-reflection polarizing film.

According to yet another aspect of the present disclosure, there is provided a structure including: an upper film stack in which a hard coating film, an upper tri-acetate cellulose film, and a polarizing film are stacked in order; and a lower film stack in which a lower tri-acetate cellulose film and a phase-difference film are stacked in order, the lower film stack located being disposed under and in contact with the upper film stack, wherein the lower tri-acetate cellulose film comprises an area not covered by the upper film stack where an adhesive material is to be applied.

An adhesive material may be disposed in the area, such that a rear surface of the display device is bent together with an end portion of a plastic substrate thereunder.

The adhesive material may cover an entire end portion of the lower film stack and cover a part of a circuit unit disposed at the end portion of the plastic substrate.

The size of the area in which the adhesive material is disposed depends on a size of a display panel or bending degrees of the end portion.

The structure may not include a barrier film in contact with the lower film stack.

The upper film stack and the lower film stack may be adapted to be employed in an organic light-emitting display (OLED) device.

It will be evident to those skilled in the art that various modifications and changes may be made in the exemplary embodiments of the present disclosure without departing from the technical idea or the gist of the present disclosure. Therefore, it should be understood that the above-described embodiments are not limiting but are illustrative in all aspects. It should be understood that the drawings and the detailed description are not intended to limit the present disclosure to the particular forms disclosed herein, but on the contrary, the intention is to cover all modifications, equivalents, and alternatives falling within the scope of the present disclosure as defined by the appended claims.

What is claimed is:

1. A display device comprising:
a flexible display panel having a display area and a bezel area surrounding the display area;
a circularly-polarizing film on the display area of the flexible display panel, the circularly-polarizing film comprising a plurality of layers;
a circuit unit connected to the flexible display panel on the bezel area of the flexible display panel; and
an adhesive member present between the circularly-polarizing film and the circuit unit,
wherein the plurality of layers of the circularly-polarizing film comprises at least a polarization layer, a phase-difference layer, and a first support layer disposed between the polarization layer and the phase-difference layer,
wherein at least the phase-difference layer extends beyond remaining layers of the plurality of layers of the circularly-polarizing film towards an edge of the bezel area such that an upper surface and a side surface of the phase-difference layer are exposed and a part of the phase-difference layer is disposed in an area corresponding to the bezel area, wherein the circuit unit and the phase-difference layer are positioned on a same surface of the flexible display panel, wherein at least the polarization layer of the remaining layers of the circularly-polarizing film is positioned only on the display area of the flexible display panel and does not extend towards the edge of the bezel area, and wherein the adhesive member covers at least the exposed upper and side surfaces of the part of the phase-difference layer disposed in the bezel area and a part of the circuit unit.

2. The display device of claim 1, wherein the plurality of layers further comprises a second auxiliary support layer facing the first support layer with the polarization layer therebetween to protect the polarization layer, and wherein the phase-difference layer is disposed below the second auxiliary support layer.

3. The display device of claim 1, wherein some layers among the plurality of layers of the circularly-polarizing film extends towards another edge that is opposed to the bezel edge.

* * * * *